United States Patent [19]
Sasaki et al.

[11] Patent Number: 5,759,433
[45] Date of Patent: Jun. 2, 1998

[54] PIEZOELECTRIC CERAMIC MATERIAL DECREASED IN LEAD CONTENT FROM STOICHIOMETORY FOR VIBRATING IN WIDE FREQUENCY RANGE AT HIGH ELECTROMECHANICAL CONVERTING EFFICIENCY

[75] Inventors: Yasuhiro Sasaki; Atsushi Ochi, both of Tokyo, Japan

[73] Assignee: NEC Corporation, Tokyo, Japan

[21] Appl. No.: 687,962

[22] Filed: Jul. 29, 1996

[30] Foreign Application Priority Data

Jul. 28, 1995 [JP] Japan .................... 7-212651

[51] Int. Cl.$^6$ .................... C04B 35/49; H01L 41/187
[52] U.S. Cl. .................... 252/62.9 PZ; 501/134
[58] Field of Search .................... 252/62.9 PZ; 501/134

[56] References Cited

U.S. PATENT DOCUMENTS

| | | | |
|---|---|---|---|
| 3,484,377 | 12/1969 | Tsubouchi et al. | 252/62.9 |
| 3,963,630 | 6/1976 | Yonezawa et al. | 252/62.9 |

FOREIGN PATENT DOCUMENTS 63-291870  11/1988  Japan ............ C04B 35/49
1179170  1/1970  United Kingdom .

OTHER PUBLICATIONS

T. Ohno et al., "The Piezoelectric, Dielectric, and Elastic Constants of the Ternary, and Quaternary Systems Consisting of $P_bT_iO_3 \cdot P_bZ_rO_3$ and Others" CPM, Feb. 25, 1992, pp. 1–12.

Nadliisky et al., "Dielectric, Piezoelectric and Pyroelectric Properties of $PbZrO_3$–$PbTiO_3$–$Pb(Mn_{1/3}Sb_{2/3})O_3$ Ferroelectric System", Ferroelectrics, vol. 129, 1992, pp. 141–146, no month.

Patent Abstracts of Japan, vol. 015, No. 090 (E–1040), Mar. 5, 1991.

Primary Examiner—Melissa Bonner
Attorney, Agent, or Firm—Sughrue, Mion, Zinn, Macpeak & Seas, PLLC

[57] ABSTRACT

Lead of ternary or quaternary piezoelectric ceramic compound is decreased by 0.1 to 5 percent by mole with respect to piezoelectric ceramic compound expressed by the chemical formula of $[Pb(Mn_{1/3}Sb_{2/3})O_3]_x[PbZrO_3]_y[PbTiO_3]_z$ where $x+Y+z=1$ or the piezoelectric ceramic compound the lead of which is partially replaced with calcium, barium or strontium, and the decrease of lead prevent the ternary or quaternary piezoelectric ceramic compound from undesirable segregation of lead compound at the grain boundaries so as to improve the mechanical output.

1 Claim, 1 Drawing Sheet

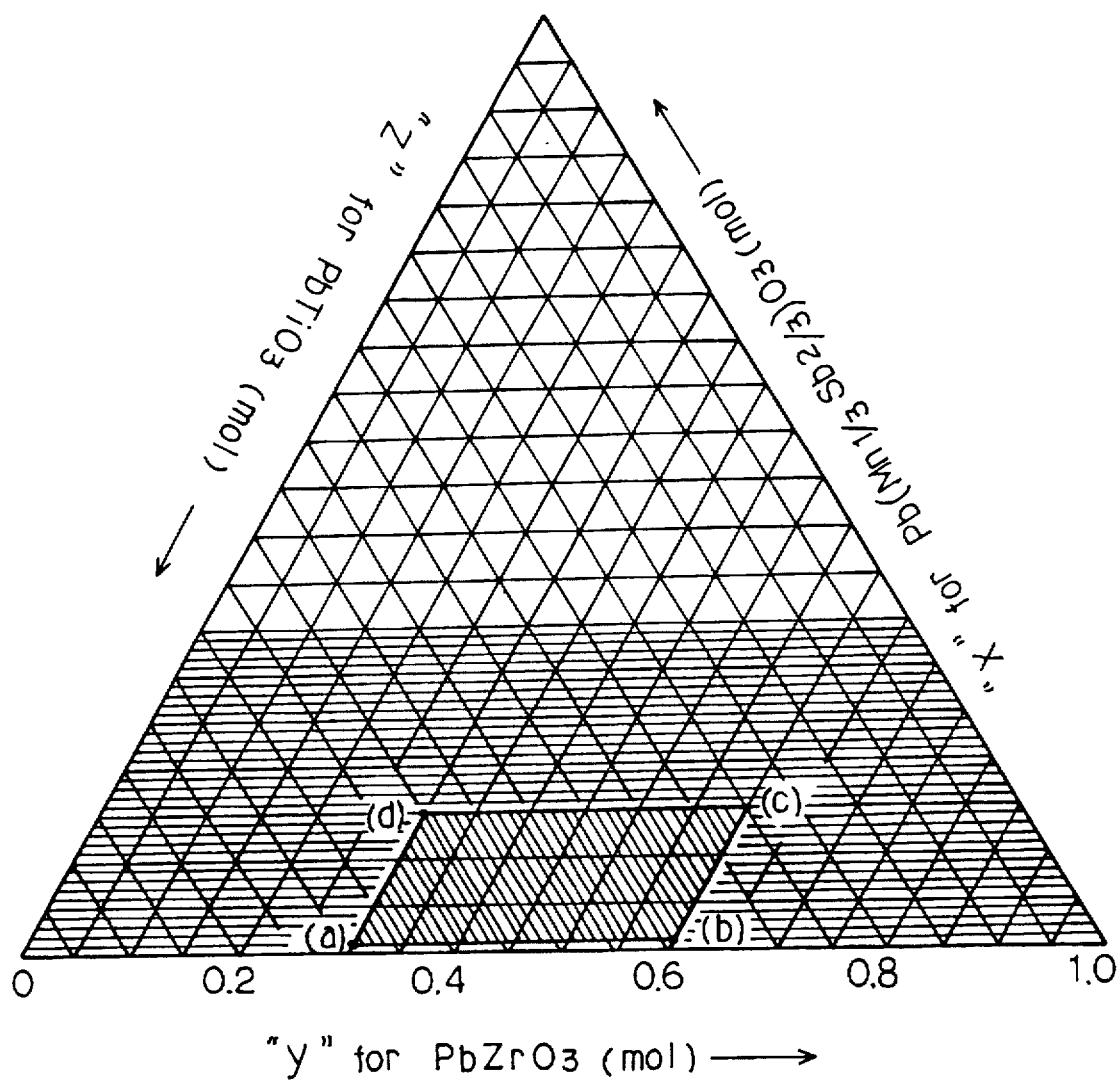
Figure

PIEZOELECTRIC CERAMIC MATERIAL DECREASED IN LEAD CONTENT FROM STOICHIOMETORY FOR VIBRATING IN WIDE FREQUENCY RANGE AT HIGH ELECTROMECHANICAL CONVERTING EFFICIENCY

FIELD OF THE INVENTION

This invention relates to a piezoelectric ceramic material and, more particularly, to a composition of a piezoelectric ceramic material decreased in lead content from the stoichiometry for vibrating in a wide frequency range at high electromechanical converting efficiency.

DESCRIPTION OF THE RELATED ART

Piezoelectric ceramic is known as an electromechanical converting material, and the piezoelectric ceramic transformer has found a wide variety of application such as, for example, a piezoelectric actuator and a supersonic motor. The piezoelectric ceramic transformer is expected to convert electric energy to mechanical force at high efficiency, and the mechanical force to be expected extends over a wide range. A high electromechanical converting efficiency is achieved by reducing an energy loss during the conversion from the electric energy to the mechanical force.

Composite perovskite lead compound is well known as the piezoelectric ceramic material, and some compositions are actually used for the piezoelectric ceramic transformer. A typical example of the lead compound for the piezoelectric ceramic transformer is a ternary compound system consisting of lead manganese antimonate expressed as $Pb(Mn_{1/3}Sb_{2/3})O_3$, lead zirconate expressed as $PbZrO_3$ and lead titanate expressed as $PbTiO3$, and a piezoelectric ceramic transformer formed of the ternary compound achieves a wide amplification. Part of lead of the ternary compound is replaced with calcium, strontium or barium, and these quaternary compounds are also available for the piezoelectric ceramic transformer for a wide amplitude.

A piezoelectric power device has been put to practical use, and is expected to increase the mechanical output. However, when the amplitude of vibrations or a vibration level is increased, the piezoelectric ceramic transformer formed of the prior art ternary/quaternary compound increases the amount of heat internally generated due to the energy loss, and the amplitude reaches the upper limit of vibration level. If the prior art piezoelectric ceramic transducer is formed to increase the amplitude over the upper limit of vibration level, the dielectric breakdown takes place in the prior art piezoelectric ceramic transducer.

An effective vibration velocity $V_0$ represents the vibration level, and is given by equation 1.

$$V0=(2)^{1/2}\pi f_0 x_{i-m} \qquad \text{equation 1}$$

where $f_0$ is a resonant frequency of the vibrator and $x_{i-m}$ is the maximum amplitude of vibrations at the leading end measured by using an optical displacement measuring equipment. The prior art ternary/quaternary compounds set limit on the vibration level or the vibration velocity $V_o$ around 0.2 m/s.

Thus, the prior art ternary/quaternary compounds merely achieve a low vibration velocity, and is hardly applied to a piezoelectric ceramic transducer expected to achieve a large mechanical output.

SUMMARY OF THE INVENTION

It is therefore an important object of the present invention to provide a piezoelectric ceramic compound which causes a piezoelectric ceramic transducer to generate a large mechanical output at least twice larger in vibration velocity than that of the prior art piezoelectric ceramic transducer.

The present inventors had contemplated the problem in the low mechanical output, and noticed segregation along the grain boundaries of the ternary/quaternary compounds. The segregated compound contained much lead. The present inventors concluded that the segregated compound impeded the propagation of the vibrations. In other words, the segregated compound was causative of the energy loss, and, accordingly, increased the heat internally generated. In this situation, even if the electric input power was increased, the large electric input power merely increased the internal energy loss, and the dielectric breakdown took place in the piezoelectric ternary/quaternary compound.

To accomplish the object, the present invention proposes to restrict the segregation by decreasing the lead.

In accordance with one aspect of the present invention, there is provided a piezoselectric ceramic compound essentially composed of lead manganese antimonate, lead zirconate and lead titanate, and containing lead decreased by 0.1 to 5.0 percent by mole with respect to a ternary piezoelectric ceramic compound expressed by the composition formula of $[Pb(Mn_{1/3}Sb_{2/3})O_3]_x[PbZrO3]_y[PbTiO_3]_z$ where $x+Y+z=1$, the composition of the ternary piezoelectric ceramic compound falls on first to fourth lines and within a range defined by the first to fourth lines, the first line is drawn between a first point defined by $x=0.01$, $y=0.30$ and $z=0.69$ and a second point defined by $x=0.01$, $y=0.60$ and $z=0.39$, the second line is drawn between the second point and a third point defined by $x=0.15$, $y=0.60$ and $z=0.25$, the third line is drawn between the third point and a fourth point defined by $x=0.15$, $y=0.30$ and $z=0.55$, and the fourth line is drawn between the fourth point and the first points.

In accordance with another aspect of the present invention, there is provided a piezoelectric ceramic compound essentially composed of lead manganese antimonate, lead zirconate, lead titanate and an element selected from the group consisting of calcium, strontium and barium replacing lead of a ternary piezoelectric ceramic compound expressed by the composition formula of $[Pb(Mn_{1/3}Sb_{2/3})O_3]_x[PbZrO_3]_y[PbTiO_3]_z$ where $x+Y+z=1$ by 15 percent by mole or less, and containing lead decreased by 0.1 to 5.0 percent by mole with respect to remaining lead of the ternary piezoelectric ceramic compound, the composition of the ternary piezoelectric ceramic compound falls on first to fourth lines and within a range defined by the first to fourth lines, the first line is drawn between a first point defined by $x=0.01$, $y=0.30$ and $z=0.69$ and a second point defined by $x=0.01$, $y=0.60$ and $z=0.39$, the second line is drawn between the second point and a third point defined by $x=0.15$, $y=0.60$ and $z=0.25$, the third line is drawn between the third point and a fourth point defined by $x=0.15$, $y=0.30$ and $z=0.55$, and the fourth line is drawn between the fourth point and the first points.

By virtue of the decrement by 0.1 to 5 percent by mole, the segregation is restricted, and the vibrations are propagated through the piezoelectric ceramic compound. As a result, the vibration velocity $V_{0max}$ is increased at least twice as large as that of the prior art piezoelectric ceramic compound.

BRIEF DESCRIPTION OF THE DRAWINGS

The features and advantages of the piezoelectric ceramic compound according to the present invention will be more clearly understood from the following description taken in conjunction with the accompanying drawings in which:

FIGURE is a diagram showing the composition of a piezoelectric ceramic compound according to the present invention.

DESCRIPTION OF THE PREFERRED EMBODIMENT

The present inventors made piezoelectric ceramic transducers as follows. Firstly, the present inventors prepared first powder of lead oxide (PbO), second powder of zirconium oxide ($ZrO_2$), third powder of titanium oxide ($TiO_2$), fourth powder of manganese carbonate, fifth powder of antimony oxide ($Sb_2O_3$) and sixth powder of calcium carbonate ($CaCO_3$), seventh powder of strontium carbonate ($SrCO_3$) and eighth powder of barium carbonate ($BaCO_3$).

When the first to eighth powders were selectively mixed, the amounts of manganese carbonate, calcium carbonate, strontium carbonate and barium carbonate were converted to those of manganese oxide (MnO), calcium oxide (CaO), strontium oxide (SrO) and barium oxide (BaO), respectively, and determined the compositions.

The first to eighth powders were selectively blended, and the blended powders were mixed in a wet mill. After the mixing in the wet mill, the mixtures were calcined in the atmospheric air at 850 degrees in centigrade for 2 hours. The calcined products were pulverized and powdered, and the pressed body formed from the powders were sintered at 1200 degrees in centigrade for 2 hours in the atmospheric air. Sintered blocks were obtained, and measured 60 millimeters in length, 30 millimeters in width and 10 millimeters in thickness.

The sintered blocks were cut into rectangular plates measuring 43 millimeters in length, 7 millimeters in width and 1 millimeter in thickness. Both major surfaces of each rectangular plate was polished, and silver electrodes were formed on the major surfaces of each of the rectangular plates. The rectangular plates were dipped into insulating oil heated to 100 degrees in centigrade, and an electric field of 4 kilo-volt/millimeter was applied between the silver electrodes. The rectangular plates were polarized for an hour under the application of the electric field in the insulating oil. After the polarization treatment, the rectangular plates were cooled in room temperature for twenty-four hours. Thus, the present inventors obtained piezoelectric ceramic transducers, and the piezoelectric ceramic transducers were labeled with sample numbers from "1" to "424" in Tables 1 to 10. Asterisk (*) on the right side of the sample numbers represented that the samples were out of the technical scope of the present invention.

The composition of each piezoelectric ceramic transducer was written in Tables 1 to 10. PMS, PZ and PT were representative of lead manganese antimonate, lead zirconate and lead titanate, respectively. The piezoelectric ceramic transducers "1*" to "53*" shown in Table 1 did not contain calcium, strontium and barium. Lead of the piezoelectric ceramic transducers "54*" to "424*" was partially replaced with calcium, strontium or barium. The lead of the piezoelectric ceramic transducers "54*" to "177*" was partially replaced with calcium, and the percentage of lead replaced with calcium was written in Tables 2–4. Similarly, the lead of the piezoelectric ceramic transducers "178*" to "300*" was partially replaced with strontium, and the percentage of lead replaced with strontium was written in Tables 5–7. The lead of the piezoelectric ceramic transducers "301*" to "424*" was partially replaced with barium, and the percentage of lead replaced with calcium was written in Tables 8–10.

The present inventors connected each of the piezoelectric ceramic transducers to an equipment using a constant current driving circuit, and caused each of the piezoelectric ceramic transducers to vibrate in the longitudinal direction thereof in the piezoelectric transverse effect mode (k31 mode). The present inventors measured the resonant frequency $f_0$ and the maximum amplitude $x_{i-m}$ of vibrations at the leading end. An optical displacement measuring equipment was used for the maximum amplitude $x_{i-m}$. The present inventors calculated the effective vibration velocity $V_0$ by using equation 1. When the temperature at the node of the vibrations was increased by 20 degrees in centigrade due to the energy loss, the present inventor decided the piezoelectric ceramic transducers reached the upper limit $V_{0max}$ of the vibration level, and wrote the values in Tables 1 to 10.

The piezoelectric ceramic transducers were essentially composed of lead manganese antimonate, lead zirconate and lead titanate, and the content of lead was decreased by 0.1 to 5 percent by mole with respect to the ternary piezoelectric ceramic compound expressed by the composition formula of $[Pb(Mn_{1/3}Sb_{2/3})O_3]_x[PbZrO_3]_y[PbTiO_3]_z$ where x+Y+z=1. As to the composition ratio x:y:z, "x" ranged from 1 percent to 15 percent by mole, "y" ranged from 30 percent to 60 percent by mole, and "z" was the remaining percentage. Even though the lead was partially replaced with calcium, strontium or barium by 15 percent by mole or less, the content of lead was also decreased by 0.1 to 5 percent by mole with respect to the ternary piezoelectric ceramic compound expressed by the above composition formula.

The present inventors plotted the compositions of the piezoelectric ceramic transducers in the figure. The composition of the ternary piezoelectric ceramic compound was expressed by a triangle in figure, and the three edges were representative of the ratio "x" of the lead manganese antimonate, the ratio "y" of the lead zirconate and the ratio "z" of the lead titanate, respectively. Points "a", "b", "c" and "d" were corresponding to the first to fourth points. When the composition fell on the four lines drawn between points "a", "b", "c" and "d" or within the range surrounded by the four lines, the limit of vibration level V0max was at least twice as large as that of the prior art piezoelectric ceramic transducer.

The reason for the composition ratio was as follows. When the lead manganese antimonate (PMS) was less than 1 percent by mole such as the piezoelectric ceramic compounds "1*" to "4*", the internal energy loss due to the motion of domain walls of ferroelectrics was too large to achieve the limit of vibration level $V_{0max}$ at least twice as large as that of the prior art piezoelectric ceramic transducer. On the other hand, when the lead manganese antimonate was greater than 15 percent by mole, undesirable pyrochlore phase and the like were produced, and these undesirable substances deteriorated the elasticity of the piezoelectric ceramic compound. As a result, even if the content of lead was decreased, the limit of vibration level $V_{0max}$ was not improved.

When the lead zirconate (PZ) was less than 30 percent or greater than 60 percent by mole, the piezoelectric ceramic compounds drastically degraded the converting capability from the electric energy to the mechanical energy, and the upper limit of vibration level $V_{0max}$ was too low.

The content of lead titanate (PT) was automatically determined by the content of lead manganese antimonate and the content of lead zirconate.

When the amount of lead was less than 0.1 percent by mole, undesirable lead compound was segregated along the grain boundaries, and deteriorated the crystal structure of the piezoelectric ceramic compound. The lead compound enlarged the internal energy loss, and the limit of vibration level V0max was not improved. On the other hand, when the lead was decreased by more than 5 percent, the petovskite crystal structure can not stably take place.

When the lead was excessively replaced with calcium, barium or strontium, the excess calcium, the excess barium or the excess strontium deteriorated the piezoelectric converting characteristics of the transducers, and the replacement of lead with the calcium, barium or strontium was maximized at 15 percent by mole.

As will be appreciated from the foregoing description, the ternary/quaternary piezoelectric complex compounds according to the present invention achieves the limit of vibration level at least twice larger than that of the prior art compound by virtue of the decrease of lead.

Although particular embodiments of the present invention have been shown and described, it will be obvious to those skilled in the art that various changes and modifications may be made without departing from the spirit and scope of the present invention.

TABLE 1

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 1* | 0 | 0 | 0 | 25 | 70 | 0.05 |
| 2* | 0 | 0 | 0 | 30 | 70 | 0.05 |
| 3* | 0 | 0 | 0 | 60 | 60 | 0.05 |
| 4* | 0 | 0 | 0 | 65 | 65 | 0.05 |
| 5* | 0 | 0 | 1 | 25 | 74 | 0.15 |
| 6* | 0 | 0 | 1 | 30 | 69 | 0.20 |
| 7* | 0 | 0 | 1 | 60 | 39 | 0.20 |
| 8* | 0 | 0 | 1 | 65 | 34 | 0.15 |
| 9 | 0 | 0.10 | 1 | 25 | 74 | 0.20 |
| 10 | 0 | 0.10 | 1 | 30 | 69 | 0.40 |
| 11 | 0 | 0.10 | 1 | 60 | 39 | 0.40 |
| 12* | 0 | 0.10 | 1 | 65 | 34 | 0.20 |
| 13* | 0 | 1.00 | 1 | 25 | 74 | 0.20 |
| 14 | 0 | 1.00 | 1 | 30 | 69 | 0.70 |
| 15 | 0 | 1.00 | 1 | 60 | 39 | 0.65 |
| 16* | 0 | 1.00 | 1 | 65 | 34 | 0.15 |
| 17* | 0 | 5.00 | 1 | 25 | 74 | 0.20 |
| 18 | 0 | 5.00 | 1 | 30 | 69 | 0.45 |
| 19 | 0 | 5.00 | 1 | 60 | 39 | 0.40 |
| 20* | 0 | 5.00 | 1 | 65 | 34 | 0.20 |
| 21* | 0 | 6.00 | 1 | 25 | 74 | 0.20 |
| 22* | 0 | 6.00 | 1 | 30 | 69 | 0.20 |
| 23* | 0 | 6.00 | 1 | 60 | 39 | 0.20 |
| 24* | 0 | 6.00 | 1 | 65 | 34 | 0.20 |
| 25* | 0 | 0 | 5 | 40 | 55 | 0.20 |
| 26 | 0 | 0.10 | 5 | 40 | 55 | 0.40 |
| 27 | 0 | 1.00 | 5 | 40 | 55 | 0.60 |
| 28 | 0 | 5.00 | 5 | 40 | 55 | 0.60 |
| 29* | 0 | 6.00 | 5 | 40 | 55 | 0.15 |
| 30* | 0 | 0 | 15 | 25 | 74 | 0.20 |
| 31* | 0 | 0 | 15 | 30 | 69 | 0.20 |
| 32* | 0 | 0 | 15 | 60 | 39 | 0.20 |
| 33* | 0 | 0 | 15 | 65 | 34 | 0.20 |
| 34* | 0 | 0.10 | 15 | 25 | 74 | 0.15 |
| 35 | 0 | 0.10 | 15 | 30 | 69 | 0.40 |
| 36 | 0 | 0.10 | 15 | 60 | 39 | 0.40 |
| 37* | 0 | 0.10 | 15 | 65 | 34 | 0.20 |
| 38* | 0 | 1.00 | 15 | 25 | 74 | 0.25 |
| 39 | 0 | 1.00 | 15 | 30 | 69 | 0.60 |
| 40 | 0 | 1.00 | 15 | 60 | 39 | 0.60 |
| 41* | 0 | 1.00 | 15 | 65 | 34 | 0.20 |
| 42* | 0 | 5.00 | 15 | 25 | 74 | 0.20 |
| 43 | 0 | 5.00 | 15 | 30 | 69 | 0.40 |
| 44 | 0 | 5.00 | 15 | 60 | 39 | 0.40 |
| 45* | 0 | 5.00 | 15 | 65 | 34 | 0.15 |
| 46* | 0 | 5.00 | 20 | 25 | 74 | 0.15 |
| 47* | 0 | 5.00 | 20 | 30 | 69 | 0.20 |
| 48* | 0 | 5.00 | 20 | 60 | 39 | 0.20 |
| 49* | 0 | 5.00 | 20 | 65 | 34 | 0.10 |
| 50* | 0 | 6.00 | 15 | 25 | 74 | 0.20 |
| 51* | 0 | 6.00 | 15 | 30 | 69 | 0.25 |
| 52* | 0 | 6.00 | 15 | 60 | 39 | 0.25 |
| 53* | 0 | 6.00 | 15 | 65 | 34 | 0.20 |

TABLE 2

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 54* | Ca/5 | 0 | 0 | 25 | 70 | 0.05 |
| 55* | 5 | 0 | 0 | 30 | 70 | 0.05 |
| 56* | 5 | 0 | 0 | 60 | 60 | 0.05 |
| 57* | 5 | 0 | 0 | 65 | 65 | 0.05 |
| 58* | 5 | 0 | 1 | 25 | 74 | 0.15 |
| 59* | 5 | 0 | 1 | 30 | 69 | 0.25 |
| 60* | 5 | 0 | 1 | 60 | 39 | 0.25 |
| 61* | 5 | 0 | 1 | 65 | 34 | 0.15 |
| 62* | 5 | 0.10 | 1 | 25 | 74 | 0.10 |
| 63 | 5 | 0.10 | 1 | 30 | 69 | 0.45 |
| 64 | 5 | 0.10 | 1 | 60 | 39 | 0.45 |
| 65* | 5 | 0.10 | 1 | 65 | 34 | 0.15 |
| 66* | 5 | 1.00 | 1 | 25 | 74 | 0.15 |
| 67 | 5 | 1.00 | 1 | 30 | 69 | 0.55 |
| 68 | 5 | 1.00 | 1 | 60 | 39 | 0.50 |
| 69* | 5 | 1.00 | 1 | 65 | 34 | 0.10 |
| 70* | 5 | 5.00 | 1 | 25 | 74 | 0.15 |
| 71 | 5 | 5.00 | 1 | 30 | 69 | 0.50 |
| 72 | 5 | 5.00 | 1 | 60 | 39 | 0.50 |
| 73* | 5 | 5.00 | 1 | 65 | 34 | 0.05 |
| 74* | 5 | 6.00 | 1 | 25 | 74 | 0.05 |
| 75* | 5 | 6.00 | 1 | 30 | 69 | 0.10 |
| 76* | 5 | 6.00 | 1 | 60 | 39 | 0.25 |
| 77* | 5 | 6.00 | 1 | 65 | 34 | 0.20 |
| 78* | 5 | 0 | 5 | 40 | 55 | 0.20 |
| 79 | 5 | 0.10 | 5 | 40 | 55 | 0.40 |
| 80 | 5 | 1.00 | 5 | 40 | 55 | 0.55 |
| 81 | 5 | 5.00 | 5 | 40 | 55 | 0.60 |
| 82* | 5 | 6.00 | 5 | 40 | 55 | 0.10 |
| 83* | 5 | 0 | 15 | 25 | 74 | 0.10 |
| 84* | 5 | 0 | 15 | 30 | 69 | 0.20 |
| 85* | 5 | 0 | 15 | 60 | 39 | 0.15 |
| 86* | 5 | 0 | 15 | 65 | 34 | 0.10 |
| 87* | 5 | 0.10 | 15 | 25 | 74 | 0.25 |
| 88 | 5 | 0.10 | 15 | 30 | 69 | 0.45 |
| 89 | 5 | 0.10 | 15 | 60 | 39 | 0.40 |
| 90* | 5 | 0.10 | 15 | 65 | 34 | 0.20 |
| 91* | 5 | 1.00 | 15 | 25 | 74 | 0.15 |
| 92 | 5 | 1.00 | 15 | 30 | 69 | 0.60 |
| 93 | 5 | 1.00 | 15 | 60 | 39 | 0.60 |
| 94* | 5 | 1.00 | 15 | 65 | 34 | 0.10 |
| 95* | 5 | 5.00 | 15 | 25 | 74 | 0.15 |
| 96 | 5 | 5.00 | 15 | 30 | 69 | 0.50 |
| 97 | 5 | 5.00 | 15 | 60 | 39 | 0.55 |
| 98* | 5 | 5.00 | 15 | 65 | 34 | 0.20 |
| 99* | 5 | 5.00 | 20 | 25 | 74 | 0.20 |

TABLE 3

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 100 | Ca/5 | 5.00 | 20 | 30 | 69 | 0.50 |
| 101 | 5 | 5.00 | 20 | 60 | 39 | 0.50 |
| 102* | 5 | 5.00 | 20 | 65 | 34 | 0.20 |
| 103* | 5 | 6.00 | 15 | 25 | 74 | 0.10 |
| 104* | 5 | 6.00 | 15 | 30 | 69 | 0.20 |
| 105* | 5 | 6.00 | 15 | 60 | 39 | 0.20 |
| 106* | 5 | 6.00 | 15 | 65 | 34 | 0.10 |
| 107* | 5 | 0 | 0 | 25 | 70 | 0.05 |
| 108* | 5 | 0 | 0 | 30 | 70 | 0.05 |
| 109* | 5 | 0 | 0 | 60 | 60 | 0.05 |
| 110* | 5 | 0 | 0 | 65 | 65 | 0.05 |
| 111* | 5 | 0 | 1 | 25 | 74 | 0.10 |
| 112* | 5 | 0 | 1 | 30 | 69 | 0.20 |
| 113* | 5 | 0 | 1 | 60 | 39 | 0.20 |
| 114* | 5 | 0 | 1 | 65 | 34 | 0.15 |
| 115* | 5 | 0.10 | 1 | 25 | 74 | 0.15 |
| 116 | 5 | 0.10 | 1 | 30 | 69 | 0.40 |
| 117 | 5 | 0.10 | 1 | 60 | 39 | 0.40 |
| 118* | 5 | 0.10 | 1 | 65 | 34 | 0.15 |
| 119* | 5 | 1.00 | 1 | 25 | 74 | 0.15 |
| 120 | 5 | 1.00 | 1 | 30 | 69 | 0.60 |
| 121 | 5 | 1.00 | 1 | 60 | 39 | 0.60 |
| 122* | 5 | 1.00 | 1 | 65 | 34 | 0.10 |
| 123* | 5 | 5.00 | 1 | 25 | 74 | 0.15 |
| 124 | 5 | 5.00 | 1 | 30 | 69 | 0.50 |
| 125 | 5 | 5.00 | 1 | 60 | 39 | 0.55 |
| 126* | 5 | 5.00 | 1 | 65 | 34 | 0.15 |
| 127* | 5 | 6.00 | 1 | 25 | 74 | 0.10 |
| 128* | 5 | 6.00 | 1 | 30 | 69 | 0.20 |
| 129* | 5 | 6.00 | 1 | 60 | 39 | 0.30 |
| 130* | 5 | 6.00 | 1 | 65 | 34 | 0.25 |
| 131* | 5 | 0 | 5 | 40 | 55 | 0.20 |
| 132 | 5 | 0.10 | 5 | 40 | 55 | 0.40 |
| 133 | 5 | 1.00 | 5 | 40 | 55 | 0.60 |
| 134 | 5 | 5.00 | 5 | 40 | 55 | 0.60 |
| 135* | 5 | 6.00 | 5 | 40 | 55 | 0.20 |
| 136* | 15 | 0 | 15 | 25 | 74 | 0.10 |
| 137* | 15 | 0 | 15 | 30 | 69 | 0.20 |
| 138* | 15 | 0 | 15 | 60 | 39 | 0.20 |
| 139* | 15 | 0 | 15 | 65 | 34 | 0.10 |
| 140* | 15 | 0.10 | 15 | 25 | 74 | 0.15 |
| 141 | 15 | 0.10 | 15 | 30 | 69 | 0.40 |
| 142 | 15 | 0.10 | 15 | 60 | 39 | 0.40 |
| 143* | 15 | 0.10 | 15 | 65 | 34 | 0.15 |
| 144* | 15 | 1.00 | 15 | 25 | 74 | 0.10 |
| 145 | 15 | 1.00 | 15 | 30 | 69 | 0.60 |
| 146 | 15 | 1.00 | 15 | 60 | 39 | 0.60 |
| 147* | 15 | 1.00 | 15 | 65 | 34 | 0.15 |
| 148* | 15 | 5.00 | 15 | 25 | 74 | 0.10 |
| 149 | 15 | 5.00 | 15 | 30 | 69 | 0.50 |

TABLE 4

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 150 | Ca/15 | 5.00 | 15 | 60 | 39 | 0.50 |
| 151* | 15 | 5.00 | 15 | 65 | 34 | 0.10 |
| 152* | 15 | 5.00 | 20 | 25 | 74 | 0.15 |
| 153 | 15 | 5.00 | 20 | 30 | 69 | 0.50 |
| 154 | 15 | 5.00 | 20 | 60 | 39 | 0.50 |
| 155* | 15 | 5.00 | 20 | 65 | 34 | 0.15 |
| 156* | 15 | 6.00 | 15 | 25 | 74 | 0.10 |
| 157* | 15 | 6.00 | 15 | 30 | 60 | 0.20 |
| 158* | 15 | 6.00 | 15 | 60 | 39 | 0.20 |
| 159* | 15 | 6.00 | 15 | 65 | 34 | 0.15 |
| 160* | 20 | 0.10 | 1 | 30 | 69 | 0.20 |
| 161* | 20 | 0.10 | 1 | 60 | 39 | 0.20 |
| 162* | 20 | 1.00 | 1 | 30 | 69 | 0.15 |
| 163* | 20 | 1.00 | 1 | 60 | 39 | 0.15 |
| 164* | 20 | 5.00 | 1 | 30 | 69 | 0.25 |
| 165* | 20 | 5.00 | 1 | 60 | 39 | 0.20 |
| 166* | 20 | 0.10 | 15 | 25 | 74 | 0.10 |
| 167* | 20 | 0.10 | 15 | 30 | 69 | 0.15 |
| 168* | 20 | 0.10 | 15 | 60 | 39 | 0.15 |
| 169* | 20 | 0.10 | 15 | 65 | 34 | 0.10 |
| 170* | 20 | 1.00 | 15 | 25 | 74 | 0.15 |
| 171* | 20 | 1.00 | 15 | 30 | 69 | 0.15 |
| 172* | 20 | 1.00 | 15 | 60 | 39 | 0.20 |
| 173* | 20 | 1.00 | 15 | 65 | 34 | 0.15 |
| 174* | 20 | 5.00 | 15 | 25 | 74 | 0.15 |
| 175* | 20 | 5.00 | 15 | 30 | 69 | 0.20 |
| 176* | 20 | 5.00 | 15 | 60 | 39 | 0.25 |
| 177* | 20 | 5.00 | 15 | 65 | 34 | 0.15 |

TABLE 5

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 178* | Sr/5 | 0 | 0 | 25 | 70 | 0.05 |
| 179* | 5 | 0 | 0 | 30 | 70 | 0.05 |
| 180* | 5 | 0 | 0 | 60 | 60 | 0.05 |
| 181* | 5 | 0 | 0 | 65 | 65 | 0.05 |
| 182* | 5 | 0 | 1 | 25 | 74 | 0.20 |
| 183* | 5 | 0 | 1 | 30 | 69 | 0.20 |
| 184* | 5 | 0 | 1 | 60 | 39 | 0.20 |
| 185* | 5 | 0 | 1 | 65 | 34 | 0.15 |
| 186* | 5 | 0.10 | 1 | 25 | 74 | 0.15 |
| 187 | 5 | 0.10 | 1 | 30 | 69 | 0.40 |
| 188 | 5 | 0.10 | 1 | 60 | 39 | 0.45 |
| 189* | 5 | 0.10 | 1 | 65 | 34 | 0.15 |
| 190* | 5 | 1.00 | 1 | 25 | 74 | 0.20 |
| 191 | 5 | 1.00 | 1 | 30 | 69 | 0.50 |
| 192 | 5 | 1.00 | 1 | 60 | 39 | 0.55 |
| 193* | 5 | 1.00 | 1 | 65 | 34 | 0.15 |
| 194* | 5 | 5.00 | 1 | 30 | 69 | 0.45 |
| 195 | 5 | 5.00 | 1 | 60 | 39 | 0.50 |
| 196* | 5 | 5.00 | 1 | 65 | 34 | 0.15 |
| 197* | 5 | 6.00 | 1 | 25 | 74 | 0.15 |
| 198* | 5 | 6.00 | 1 | 30 | 69 | 0.10 |
| 199* | 5 | 6.00 | 1 | 60 | 39 | 0.15 |
| 200* | 5 | 6.00 | 1 | 65 | 34 | 0.20 |
| 201* | 5 | 0 | 5 | 40 | 55 | 0.10 |
| 202 | 5 | 0.10 | 5 | 40 | 55 | 0.40 |
| 203 | 5 | 1.00 | 5 | 40 | 55 | 0.55 |
| 204 | 5 | 5.00 | 5 | 40 | 55 | 0.60 |
| 205* | 5 | 6.00 | 5 | 40 | 55 | 0.15 |
| 206* | 5 | 0 | 15 | 25 | 74 | 0.05 |
| 207* | 5 | 0 | 15 | 30 | 69 | 0.20 |
| 208* | 5 | 0 | 15 | 60 | 39 | 0.15 |
| 209* | 5 | 0 | 15 | 65 | 34 | 0.10 |
| 210* | 5 | 0.10 | 15 | 25 | 74 | 0.15 |
| 211 | 5 | 0.10 | 15 | 30 | 69 | 0.45 |
| 212 | 5 | 0.10 | 15 | 60 | 39 | 0.40 |
| 213* | 5 | 0.10 | 15 | 65 | 34 | 0.10 |
| 214* | 5 | 1.00 | 15 | 25 | 74 | 0.15 |
| 215 | 5 | 1.00 | 15 | 30 | 69 | 0.60 |
| 216 | 5 | 1.00 | 15 | 60 | 39 | 0.60 |
| 217* | 5 | 1.00 | 15 | 65 | 34 | 0.15 |
| 218* | 5 | 5.00 | 15 | 25 | 74 | 0.10 |
| 219 | 5 | 5.00 | 15 | 30 | 69 | 0.50 |

TABLE 6

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 220 | Sr/5 | 5.00 | 15 | 60 | 39 | 0.50 |
| 221* | 5 | 5.00 | 15 | 65 | 34 | 0.10 |
| 222* | 5 | 5.00 | 20 | 25 | 74 | 0.20 |
| 223* | 5 | 5.00 | 20 | 30 | 69 | 0.20 |
| 24* | 5 | 5.00 | 20 | 60 | 39 | 0.20 |
| 225* | 5 | 5.00 | 20 | 65 | 34 | 0.20 |
| 226* | 5 | 6.00 | 15 | 25 | 74 | 0.10 |
| 227* | 5 | 6.00 | 15 | 30 | 69 | 0.20 |
| 228* | 5 | 6.00 | 15 | 60 | 39 | 0.20 |
| 229* | 5 | 6.00 | 15 | 65 | 34 | 0.10 |
| 230* | 5 | 0 | 0 | 25 | 70 | 0.05 |
| 231* | 5 | 0 | 0 | 30 | 70 | 0.05 |
| 232* | 5 | 0 | 0 | 60 | 60 | 0.05 |
| 233* | 5 | 0 | 0 | 65 | 65 | 0.05 |
| 234* | 5 | 0 | 1 | 25 | 74 | 0.05 |
| 235* | 5 | 0 | 1 | 30 | 69 | 0.15 |
| 236* | 5 | 0 | 1 | 60 | 39 | 0.20 |
| 237* | 5 | 0 | 1 | 65 | 34 | 0.05 |
| 238* | 5 | 0.10 | 1 | 25 | 74 | 0.10 |
| 239 | 5 | 0.10 | 1 | 30 | 69 | 0.15 |
| 240 | 5 | 0.10 | 1 | 65 | 34 | 0.10 |
| 241* | 5 | 0.10 | 1 | 65 | 34 | 0.10 |
| 242* | 5 | 1.00 | 1 | 25 | 74 | 0.15 |
| 243 | 5 | 1.00 | 1 | 30 | 69 | 0.60 |
| 244 | 5 | 1.00 | 1 | 60 | 39 | 0.60 |
| 245* | 5 | 1.00 | 1 | 65 | 34 | 0.15 |
| 246* | 5 | 5.00 | 1 | 25 | 74 | 0.20 |
| 247 | 5 | 5.00 | 1 | 30 | 69 | 0.50 |
| 248 | 5 | 5.00 | 1 | 60 | 39 | 0.50 |
| 249* | 5 | 5.00 | 1 | 65 | 34 | 0.15 |
| 250* | 5 | 6.00 | 1 | 25 | 74 | 0.10 |
| 251* | 5 | 6.00 | 1 | 30 | 69 | 0.20 |
| 252* | 5 | 6.00 | 1 | 60 | 39 | 0.30 |
| 253* | 5 | 6.00 | 1 | 65 | 34 | 0.15 |
| 254* | 5 | 0 | 5 | 40 | 55 | 0.20 |
| 255 | 5 | 0.10 | 5 | 40 | 55 | 0.40 |
| 256 | 5 | 1.00 | 5 | 40 | 55 | 0.60 |
| 257 | 5 | 5.00 | 5 | 40 | 55 | 0.60 |
| 258* | 5 | 6.00 | 5 | 40 | 55 | 0.20 |
| 259* | 15 | 0 | 15 | 25 | 74 | 0.10 |
| 260* | 15 | 0 | 15 | 30 | 69 | 0.20 |
| 261* | 15 | 0 | 15 | 60 | 39 | 0.20 |
| 262* | 15 | 0 | 15 | 65 | 34 | 0.10 |
| 263* | 15 | 0.10 | 15 | 25 | 74 | 0.15 |
| 264 | 15 | 0.10 | 15 | 30 | 69 | 0.40 |
| 265 | 15 | 0.10 | 15 | 60 | 39 | 0.40 |
| 266* | 15 | 0.10 | 15 | 65 | 34 | 0.20 |
| 267* | 15 | 1.00 | 15 | 25 | 74 | 0.20 |
| 268 | 15 | 1.00 | 15 | 30 | 69 | 0.60 |
| 269 | 15 | 1.00 | 15 | 60 | 39 | 0.60 |

TABLE 7

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 270* | Sr/15 | 1.00 | 15 | 65 | 34 | 0.15 |
| 271* | 15 | 5.00 | 15 | 25 | 74 | 0.20 |
| 272 | 15 | 5.00 | 15 | 30 | 69 | 0.50 |
| 273 | 15 | 5.00 | 15 | 60 | 39 | 0.50 |
| 274* | 15 | 5.00 | 15 | 65 | 34 | 0.20 |
| 275* | 15 | 5.00 | 20 | 25 | 74 | 0.15 |
| 276 | 15 | 5.00 | 20 | 30 | 69 | 0.50 |
| 277 | 15 | 5.00 | 20 | 60 | 39 | 0.50 |
| 278* | 15 | 5.00 | 20 | 65 | 34 | 0.15 |
| 279* | 15 | 6.00 | 15 | 25 | 74 | 0.20 |
| 280* | 15 | 6.00 | 15 | 30 | 69 | 0.20 |
| 281* | 15 | 6.00 | 15 | 60 | 39 | 0.20 |
| 282* | 15 | 6.00 | 15 | 65 | 34 | 0.20 |
| 283* | 20 | 0.10 | 1 | 30 | 69 | 0.20 |
| 284* | 20 | 0.10 | 1 | 60 | 39 | 0.20 |
| 285* | 20 | 1.00 | 1 | 30 | 69 | 0.15 |
| 286* | 20 | 1.00 | 1 | 60 | 39 | 0.15 |
| 287* | 20 | 5.00 | 1 | 30 | 69 | 0.20 |
| 288* | 20 | 5.00 | 1 | 60 | 39 | 0.20 |
| 289* | 20 | 0.10 | 15 | 25 | 74 | 0.10 |
| 290* | 20 | 0.10 | 15 | 30 | 69 | 0.20 |
| 291* | 20 | 0.10 | 15 | 60 | 39 | 0.20 |
| 292* | 20 | 0.10 | 15 | 65 | 34 | 0.10 |
| 293* | 20 | 1.00 | 15 | 25 | 74 | 0.10 |
| 294* | 20 | 1.00 | 15 | 30 | 69 | 0.20 |
| 295* | 20 | 1.00 | 15 | 60 | 39 | 0.20 |
| 296* | 20 | 1.00 | 15 | 65 | 34 | 0.15 |
| 297* | 20 | 5.00 | 15 | 25 | 74 | 0.05 |
| 298* | 20 | 5.00 | 15 | 30 | 69 | 0.15 |
| 299* | 20 | 5.00 | 15 | 60 | 39 | 0.15 |
| 300* | 20 | 5.00 | 15 | 65 | 34 | 0.10 |

TABLE 8

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 301* | Ba/5 | 0 | 0 | 25 | 70 | 0.05 |
| 302* | 5 | 0 | 0 | 30 | 70 | 0.05 |
| 303* | 5 | 0 | 0 | 60 | 60 | 0.05 |
| 304* | 5 | 0 | 0 | 65 | 65 | 0.05 |
| 305* | 5 | 0 | 1 | 25 | 74 | 0.10 |
| 306* | 5 | 0 | 1 | 30 | 69 | 0.25 |
| 307* | 5 | 0 | 1 | 60 | 39 | 0.25 |
| 308* | 5 | 0 | 1 | 65 | 34 | 0.10 |
| 309* | 5 | 0.10 | 1 | 25 | 74 | 0.20 |
| 310 | 5 | 0.10 | 1 | 30 | 69 | 0.45 |
| 311 | 5 | 0.10 | 1 | 60 | 39 | 0.45 |
| 312* | 5 | 0.10 | 1 | 65 | 34 | 0.10 |
| 313* | 5 | 1.00 | 1 | 25 | 74 | 0.15 |
| 314 | 5 | 1.00 | 1 | 30 | 69 | 0.55 |
| 315 | 5 | 1.00 | 1 | 60 | 39 | 0.50 |
| 316* | 5 | 1.00 | 1 | 65 | 34 | 0.15 |
| 317* | 5 | 5.00 | 1 | 25 | 74 | 0.15 |
| 318 | 5 | 5.00 | 1 | 30 | 69 | 0.50 |
| 319 | 5 | 5.00 | 1 | 60 | 39 | 0.55 |
| 320* | 5 | 5.00 | 1 | 65 | 34 | 0.15 |
| 321* | 5 | 6.00 | 1 | 25 | 74 | 0.05 |
| 322* | 5 | 6.00 | 1 | 30 | 69 | 0.30 |
| 323* | 5 | 6.00 | 1 | 60 | 39 | 0.25 |
| 324* | 5 | 6.00 | 1 | 65 | 34 | 0.10 |
| 325* | 5 | 0 | 5 | 40 | 55 | 0.20 |
| 326 | 5 | 0.10 | 5 | 40 | 55 | 0.40 |
| 327 | 5 | 1.00 | 5 | 40 | 55 | 0.55 |
| 328 | 5 | 5.00 | 5 | 40 | 55 | 0.45 |
| 329* | 5 | 6.00 | 5 | 40 | 55 | 0.25 |
| 330* | 5 | 0 | 15 | 25 | 74 | 0.20 |
| 331* | 5 | 0 | 15 | 30 | 69 | 0.20 |
| 332* | 5 | 0 | 15 | 60 | 39 | 0.15 |
| 333* | 5 | 0 | 15 | 65 | 34 | 0.20 |
| 334* | 5 | 0.10 | 15 | 25 | 74 | 0.25 |
| 335 | 5 | 0.10 | 15 | 30 | 69 | 0.45 |
| 336 | 5 | 0.10 | 15 | 60 | 39 | 0.40 |
| 337* | 5 | 0.10 | 15 | 65 | 34 | 0.20 |
| 338* | 5 | 1.00 | 15 | 25 | 74 | 0.15 |
| 339 | 5 | 1.00 | 15 | 30 | 69 | 0.60 |

TABLE 9

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 340 | Ba/5 | 1.00 | 15 | 60 | 39 | 0.60 |
| 341* | 5 | 1.00 | 15 | 65 | 34 | 0.10 |
| 342* | 5 | 5.00 | 15 | 25 | 74 | 0.15 |
| 343 | 5 | 5.00 | 15 | 30 | 69 | 0.50 |
| 344 | 5 | 5.00 | 15 | 60 | 39 | 0.50 |
| 345* | 5 | 5.00 | 15 | 65 | 34 | 0.10 |
| 346* | 5 | 5.00 | 20 | 25 | 74 | 0.20 |
| 347 | 5 | 5.00 | 20 | 30 | 69 | 0.55 |
| 348 | 5 | 5.00 | 20 | 60 | 39 | 0.50 |
| 349* | 5 | 5.00 | 20 | 65 | 34 | 0.20 |
| 350* | 5 | 6.00 | 15 | 25 | 74 | 0.10 |
| 351* | 5 | 6.00 | 15 | 30 | 69 | 0.20 |
| 352* | 5 | 6.00 | 15 | 60 | 39 | 0.20 |
| 353* | 5 | 6.00 | 15 | 65 | 34 | 0.10 |
| 354* | 5 | 0 | 0 | 25 | 70 | 0.05 |
| 355* | 5 | 0 | 0 | 30 | 70 | 0.05 |
| 356* | 5 | 0 | 0 | 60 | 60 | 0.05 |
| 357* | 5 | 0 | 0 | 65 | 65 | 0.05 |
| 358* | 5 | 0 | 1 | 25 | 74 | 0.20 |
| 359* | 5 | 0 | 1 | 30 | 69 | 0.15 |
| 360* | 5 | 0 | 1 | 60 | 39 | 0.20 |
| 361* | 5 | 0 | 1 | 65 | 34 | 0.20 |
| 362* | 5 | 0.10 | 1 | 25 | 74 | 0.15 |
| 363 | 5 | 0.10 | 1 | 30 | 69 | 0.40 |
| 364 | 5 | 0.10 | 1 | 60 | 39 | 0.40 |
| 365* | 5 | 0.10 | 1 | 65 | 34 | 0.15 |
| 366* | 5 | 1.00 | 1 | 25 | 74 | 0.15 |
| 367 | 5 | 1.00 | 1 | 30 | 69 | 0.60 |
| 368 | 5 | 1.00 | 1 | 60 | 39 | 0.60 |
| 369* | 5 | 1.00 | 1 | 65 | 34 | 0.20 |
| 370* | 5 | 5.00 | 1 | 25 | 74 | 0.20 |
| 371 | 5 | 5.00 | 1 | 30 | 69 | 0.50 |
| 372 | 5 | 5.00 | 1 | 60 | 39 | 0.50 |
| 373* | 5 | 5.00 | 1 | 65 | 34 | 0.15 |
| 374* | 5 | 6.00 | 1 | 25 | 74 | 0.10 |
| 375* | 5 | 6.00 | 1 | 30 | 69 | 0.20 |
| 376* | 5 | 6.00 | 1 | 60 | 39 | 0.30 |
| 377* | 5 | 6.00 | 1 | 65 | 34 | 0.15 |
| 378* | 5 | 0 | 5 | 40 | 55 | 0.20 |
| 379 | 5 | 0.10 | 5 | 40 | 55 | 0.40 |
| 380 | 5 | 1.00 | 5 | 40 | 55 | 0.60 |
| 381 | 5 | 5.00 | 5 | 40 | 55 | 0.60 |
| 382* | 5 | 6.00 | 5 | 40 | 55 | 0.20 |
| 383* | 15 | 0 | 15 | 25 | 74 | 0.10 |
| 384* | 15 | 0 | 15 | 30 | 69 | 0.20 |
| 385* | 15 | 0 | 15 | 60 | 39 | 0.20 |
| 386* | 15 | 0 | 15 | 65 | 34 | 0.10 |
| 387* | 15 | 0.10 | 15 | 25 | 74 | 0.15 |
| 388 | 15 | 0.10 | 15 | 30 | 69 | 0.40 |
| 389 | 15 | 0.10 | 15 | 60 | 39 | 0.40 |

TABLE 10

| Sample | pb replaced with Ca/Sr/Ba (mole %) | Decrement of Pb (mole %) | PMS (mole %) | PZ (mole %) | PT (mole %) | Upper limit of Vibration level (m/s) |
|---|---|---|---|---|---|---|
| 390* | Ba/15 | 0.10 | 15 | 65 | 34 | 0.20 |
| 391* | 15 | 1.00 | 15 | 25 | 74 | 0.30 |
| 392 | 15 | 1.00 | 15 | 25 | 74 | 0.30 |
| 393 | 15 | 1.00 | 15 | 60 | 39 | 0.60 |
| 394* | 15 | 1.00 | 15 | 65 | 34 | 0.25 |
| 395* | 15 | 5.00 | 15 | 25 | 74 | 0.20 |
| 396 | 15 | 5.00 | 15 | 30 | 69 | 0.50 |
| 397 | 15 | 5.00 | 15 | 60 | 39 | 0.50 |
| 398* | 15 | 5.00 | 15 | 65 | 34 | 0.20 |
| 399* | 15 | 5.00 | 20 | 25 | 74 | 0.15 |
| 400 | 15 | 5.00 | 20 | 30 | 69 | 0.50 |
| 401 | 15 | 5.00 | 20 | 60 | 39 | 0.50 |
| 402* | 15 | 5.00 | 20 | 65 | 34 | 0.10 |
| 403* | 15 | 6.00 | 15 | 25 | 74 | 0.15 |
| 404* | 15 | 6.00 | 15 | 30 | 69 | 0.20 |
| 405* | 15 | 6.00 | 15 | 60 | 39 | 0.20 |
| 406* | 15 | 6.00 | 15 | 65 | 34 | 0.10 |
| 407* | 20 | 0.10 | 1 | 30 | 69 | 0.20 |
| 408* | 20 | 0.10 | 1 | 60 | 39 | 0.20 |
| 409* | 20 | 1.00 | 1 | 30 | 69 | 0.25 |
| 410* | 20 | 1.00 | 1 | 30 | 39 | 0.20 |
| 411* | 20 | 5.00 | 1 | 30 | 69 | 0.20 |
| 412* | 20 | 5.00 | 1 | 60 | 39 | 0.15 |
| 413* | 20 | 0.10 | 15 | 25 | 74 | 0.10 |
| 414* | 20 | 0.10 | 15 | 30 | 69 | 0.20 |
| 415* | 20 | 0.10 | 15 | 60 | 39 | 0.20 |
| 416* | 20 | 0.10 | 15 | 65 | 34 | 0.10 |
| 417* | 20 | 1.00 | 15 | 25 | 74 | 0.15 |
| 418* | 20 | 1.00 | 15 | 30 | 69 | 0.15 |
| 419* | 20 | 1.00 | 15 | 60 | 39 | 0.15 |
| 420* | 20 | 1.00 | 15 | 65 | 34 | 0.15 |
| 421* | 20 | 5.00 | 15 | 25 | 74 | 0.10 |
| 422* | 20 | 5.00 | 15 | 30 | 69 | 0.15 |
| 423* | 20 | 5.00 | 15 | 60 | 39 | 0.15 |
| 424* | 20 | 5.00 | 15 | 65 | 34 | 0.10 |

What is claimed is:

1. A piezoelectric ceramic compound consisting essentially of lead manganese antimonate, lead zirconate, lead titanate and an element selected from the group consisting of calcium, strontium, and barium replacing lead of a ternary piezoelectric ceramic compound expressed by the composition formula of $(Pb(Mn_{1/3}Sb_{2/3})O_3)_x$ $(PbZrO_3)_y$ $(PbTiO_3)_z$ where x+y+z=1 by 15 percent by mole or less, and containing lead decreased by 0.1 to 5.0 percent by mole with respect to remaining lead of said ternary piezoelectric ceramic compound, the composition of said ternary piezoelectric ceramic compound defined by the region on the phase diagram of the Figure bounded by a first point defined by x=0.01, y=0.30 and z=0.69; a second point defined by x=0.01, y=0.60 and z=0.39; a third point defined by x=0.15, y=0.60 and z=0.25; and a fourth point defined by x=0.15, y=0.30 and z=0.55.

* * * * *

UNITED STATES PATENT AND TRADEMARK OFFICE
CERTIFICATE OF CORRECTION

PATENT NO. : 5,759,433
DATED : June 2, 1998
INVENTOR(S) : Yasuhiro SASAKI

It is certified that error appears in the above-identified patent and that said Letters Patent is hereby corrected as shown below:

Col. 7, line 10, TABLE 3, change "0.1.0" to --0.10--.

Col. 8, TABLE 5, after line 44, insert the following line
--193*    5    5.00    1    25    74    0.10--.

Col. 9, line 22, TABLE 6, Sample 239, change "0.15" to --0.40--.

Col. 9, line 23, TABLE 6, Sample 240, change "65" to --60--.

Col. 9, line 23, TABLE 6, Sample 240, change "0.10" to --0.40--.

Col. 12, line 22, TABLE 10, Sample 410*, change "30" to --60--.

Col. 12, line 7, TABLE 10, Sample 392, change "0.30" to -0.60--.

Signed and Sealed this

Fourth Day of May, 1999

Attest:

Q. TODD DICKINSON

*Attesting Officer*            *Acting Commissioner of Patents and Trademarks*